United States Patent [19]

Fabry et al.

[11] Patent Number: 5,352,637
[45] Date of Patent: Oct. 4, 1994

[54] PROCESS FOR PRODUCING STORAGE-STABLE SILICON WAFER SURFACES HAVING ADVANTAGEOUS OXIDATION PROPERTIES AND SILICON WAFER FORED THEREBY

[75] Inventors: Laszlo Fabry; Manfred Grundner; Dieter Graef; Susanne Bauer-Mayer; Peter John, all of Burghausen, Fed. Rep. of Germany

[73] Assignee: Wacker-Chemitronic Gesellschaft für Elektronik-Grundstoffe mbH, Burghausen, Fed. Rep. of Germany

[21] Appl. No.: 961,083

[22] Filed: Oct. 14, 1992

[30] Foreign Application Priority Data

Nov. 28, 1991 [DE] Fed. Rep. of Germany ....... 4139205

[51] Int. Cl.$^5$ ............................................. H01L 21/302
[52] U.S. Cl. .................................. 437/238; 437/974; 148/33
[58] Field of Search ............. 437/235, 238, DIG. 974; 148/33

[56] References Cited

U.S. PATENT DOCUMENTS

| | | | |
|---|---|---|---|
| 4,270,316 | 6/1981 | Kramer et al. | 51/283 R |
| 4,724,171 | 2/1988 | Lampert | 427/299 |
| 4,885,106 | 12/1989 | Lapham et al. | 252/100 |
| 4,973,563 | 11/1990 | Prigge et al. | 437/225 |
| 5,008,127 | 4/1991 | Ogawa | 427/36 |
| 5,219,613 | 6/1993 | Fabry et al. | 437/235 |

OTHER PUBLICATIONS

"Effect of Silicon Surface Cleaning Procedures on Oxidation Kinetics and Surface Chemistry," by Delarios et al., *Appl. Surf. Sci.* 30, 17–24, 1987.

"The Effect of Fluorine Additions to the Oxidation of Silicon," by Kim et al., *J. Electromechm. Soc.*, vol. 137, No. 7, Jul. 1990, 2291–2296.

"Theoretical Model for Self-Interstitial Generation at the $Si/SiO_2$ Interface During Thermal Oxidation of Silicon," Taniguchi et al., *Journ. Appl. Phys.* 65(7), Apr. 1, 1989, 2723–2727.

"Effects of the Presence/Absence of HCl during Gate Oxidation . . . " by Proano et al., *J. Appl. Phys.* 66 (5), Sep. 1, 1989, 2189–2199.

"Correlations Between Self-Interstitials and Vacancies During Thermal Oxidation in Silicon" by Okino, *Jap. Journ. Appl. Phys.*, vol. 30, No. 5A, May 1991, L857–L859.

"Silicon Gate Oxide Thickness Uniformity During HCl Oxidation" by Osburn et al., *J. Electrochem. Soc.*, vol. 138, Jan. 1991, 268–277.

"Cleaning Solutions Based on Hydrogen Peroxide for Use in Silicon Semiconductor Technology" by Kern et al., *RCA Review*, Jun. 1970, 187–206.

*Primary Examiner*—R. Bruce Breneman
*Assistant Examiner*—Jonathan D. Baskin
*Attorney, Agent, or Firm*—Collard & Roe

[57] ABSTRACT

A process for producing silicon wafers which have a storage-stable surface and which can be thermally oxidized directly, that is to say, without a prior HF immersion bath, and without the addition of halogen-containing gases, it being possible to achieve an equal or better oxidation result than that achieved by including these measures.

20 Claims, No Drawings

PROCESS FOR PRODUCING STORAGE-STABLE SILICON WAFER SURFACES HAVING ADVANTAGEOUS OXIDATION PROPERTIES AND SILICON WAFER FORED THEREBY

BACKGROUND OF THE INVENTION

1. Field of the Invention

The present invention relates to a process for producing storage-stable polished silicon wafer surfaces having advantageous oxidation properties by hydrophilizing treatment of the polished wafer surfaces and a subsequent exposure to an organosilicon reagent.

2. The Prior Art

The requirements relating to the quality of silicon wafers for producing electronic components and, in particular, highly integrated memory chips are increasing in parallel with the continuous increase in integration density. This applies especially to the quality of polished silicon wafer surfaces into which the electronic structures are etched in numerous process steps. These surfaces are required to have a specified, unaltering chemical composition over the period from production to further processing. A reproducible quality standard can only be achieved with the proviso that the initial requirements are the same. No part must be played by environmental effects during the transportation and the storage of wafers until they are processed further to produce electronic components.

According to U.S. Pat. No. 4,270,316, an adequate storage stability is achieved, for example, if the wafer surface acquires a protective layer of trialkylsilyl radicals through treatment with a reagent capable of trialkylsilylation. This avoids the occurrence of aging effects, which can be attributed primarily to the surface adsorption of water, and manifest themselves in a little-valued clouding of the polished surface, the so-called "haze."

Since virtually every component production process in modern silicon technology starts with the thermal oxidation of the wafer surface, attention has to be paid in the preparation of the wafers not only to their storage stability, but particularly to the requirement that the pretreatment of the wafer surfaces does not in any way impede the oxidation process. As a result of the thermal oxidation, the trialkylsilyl radicals mentioned are burnt to form carbon dioxide and water and are able to escape. However, because of the high proportion of carbon in the trialkylsilyl group, the pyrolysis is incomplete, with the result that carbon contaminates the wafer surface.

In addition, it is known that, following a treatment with hydrogen fluoride in an immersion bath (HF immersion bath), the oxidation rates of oxide-free surfaces are particularly high (J. M. Delarios et al., Appl. Surf. Sci. 30, 17–24, 1987). For this reason, and because of the cleaning action of the HF immersion bath, this measure is preferably carried out prior to the thermal oxidation. The oxide growth is also accelerated by the addition of fluorine-containing gases during the thermal oxidation (Kim et al., J. Electrochem. Soc., 139(7), 2291–2296, 1990).

It is furthermore known (K. Taniguchi, Y. Shibata, C. Hamaguchi, J. Appl. Phys., 65 (7), 2723–2727, 1989) that, during the thermal oxidation, silicon interstitial atoms are produced to an increased extent in the interface region between atomic and oxidic silicon and these are responsible not only for accelerated oxidation kinetics, but also for the appearance of dislocations in the crystal ("oxidation-induced stacking faults" (OSF)).

Finally, it is known (R. E. Proano, D. G. Ast., J. Appl. Phys., 66 (5), 2189–2199, 1989) that the silicon interstitial atoms and, along with them, the OSFs, can be reduced by adding halogen-containing gases such as, for example, hydrogen chloride, trichloroethane or freon, during the oxidation step. In addition, halogen-containing gases also remove metallic impurities, in particular transition metals, as a further source of undesirable OSFs (T. Okino, Jap. J. of Appl. Phys., 30 (5A), L857–859, 1991).

However, if hydrogen chloride is added during the thermal oxidation, inhomogeneities, which are also known to the person skilled in the art by the term "bull's eye pattern" (C. M. Osborn et al., J. Electrochem. Soc., 138 (1), 268–277, 1991), are observed in the thickness distribution of the oxide layer produced.

Nevertheless, in the interest of a rapid oxidation and an optimized oxidation result in the form of a thin and integral silicon oxide layer while preserving a dislocation-free silicon substrate, an HF immersion bath prior to the thermal oxidation has hitherto been deemed advisable and the adding of halogen-containing gases in the course of the thermal oxidation has been deemed indispensable.

SUMMARY OF THE INVENTION

It is an object of the present invention to prepare silicon wafers having a storage-stable surface which can be thermally oxidized directly, that is to say, without prior HF immersion bath, and without the addition of halogen-containing gases, it being possible at the same time to achieve an oxidation result equal to or better than that achieved by including these measures.

The object is achieved according to the invention by providing a process for producing storage-stable polished surfaces for a silicon wafer having advantageous oxidation properties comprising:

hydrophilizing the polished wafer surfaces;

subsequently exposing said polished wafer surfaces to an organosilicon reagent; and using as said organosilicon reagent a compound selected from the group consisting of haloalkylsilanes having the formula

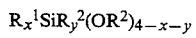

haloalkyldisilazanes having the formula

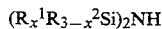

and the mixtures thereof, where $R^1$ is a haloalkyl radical, $R^2$ is an alkyl radical, x is an integer from 1 to 3, and y is the numeral 0 or 1.

Surprisingly, it has been found that silicon wafer surfaces treated in this way not only do not have to be prepared for the thermal oxidation by an HF immersion bath, but an addition of halogen-containing gases during the oxidation itself is also not necessary to achieve the normal oxidation result. In addition, the treated wafer surfaces have an outstanding storage stability.

The hydrophilizing treatment of the silicon wafers preceding the exposure to the organosilicon reagent comprises, for example, an alkaline oxidation cleaning step by immersing the polished wafers in a hydrogen peroxide/ammonia solution. This process, described as "RCA cleaning," has been described by W. Kern and D. Puotinen in RCA Review, June, 1970, pages 187–206. The hydrophilizing action of the cleaning process is primarily due to the formation of Si-OH groups on the wafer surface. Similar actions can also be effected by treating the wafer surfaces with aqueous acidic hydrogen peroxide solution, in particular hydrogen peroxide solution containing hydrochloric acid, or with ozone-containing aqueous solution. Also suitable are solutions which contain, for example, hypochlorites, such as, for instance, sodium hypochlorite. The wafers can also be anodically hydrophilized in alkaline solution. In the last mentioned cases, however, attention has to be paid to a possible contamination of the wafer surface with interfering cations. Finally, the hydrophilization can also be carried out via the gas phase in a moist oxygen-containing atmosphere.

Subsequent to such a hydrophilization of the polished wafer surfaces, which may optionally also comprise a combination of a plurality of steps, in which connection the wafers may be polished on one or both sides, the wafers are beneficially washed with water and dried in order to prevent interfering side reactions with the organosilicon reagent to which they are subsequently exposed. Experience shows that waiting times of up to 12 hours before the exposure to the organosilicon reagent are still acceptable. It is, however, expedient to initiate this step without delay.

In principle, it is possible to expose the wafer surface, for example, by spraying-on, pouring-on, spinning-on or immersion, to a selected individual organosilicon compound or to a mixture of individual compounds in liquid form, as reagent. More beneficial, and preferable purely for cleanliness reasons, however, is exposure via the gas phase, advantageously via a carrier gas, for example nitrogen or argon enriched with the compounds envisaged. In this case, the enrichment can be carried out and controlled in the manner known by means of metering devices such as temperature-controlled evaporators ("bubblers"). Suitable for gassing the wafers are the reaction chambers or bell jars which are standard for gas treatment in semiconductor technology. A particularly simple possibility is to introduce a small quantity, i.e., as a rule one or more drops of the reagent, into the packaging provided, and in this way to produce a gas phase suitable for reaction with the wafer surface.

The most beneficial treatment time is expediently determined in preliminary trials. As a rule, however, times of about 5 to 200 minutes are adequate for an effective treatment of the wafer surface. In the event of inclusion of the reagent in the packaging, the wafer surface beneficially remains exposed to the atmosphere enriched with organosilicon reagent for up to 24 hours or longer.

The wafer surface is expediently treated with the organosilicon reagent in a temperature range up to 150° C, preferably from 20° to 60° C.

Advantageously, those organosilicon compounds are selected which are sufficiently volatile at the specified temperatures and ensure a high proportion of substance in the gas phase for the interaction with the wafer surface without additional measures. Particularly suitable are compounds which have a vapor pressure of not less than 0.5 hPa at a temperature of 25° C. and a pressure of 1,000 hPa.

The presence of at least one haloalkyl radical in the organosilicon reagent used for exposure is essential for the advantageous oxidation properties of the treated wafer surfaces. Beneficially, haloalkylsilanes having the formula $$R_x^1 SiR_y^2 (OR^2)_{4-x-y}$$

and haloalkyldisilazanes having the formula $$(R_x^1 R_{3-x}^2 Si)_2 NH$$

are used.

$R^1$ is a haloalkyl radical, $R^2$ is an alkyl radical, x is an integer from 1 to 3, and y is the numeral 0 or 1.

The haloalkyl radicals $R^1$ preferably carry fluorine or chlorine atoms and have a maximum chain length of three carbon atoms. In the case of the alkyl radicals $R^2$, too, short chain lengths are advantageous, in which connection methyl and ethyl groups prove particularly advantageous. The best oxidation results are achieved with 1,3,3,3-tetrachloropropyltrimethoxysilane, 3,3,3trifluoropropylmethyldimethoxysilane and bis(3,3,3-trifluoropropyl)tetramethyldisilazane as a mixture or as individual compounds.

The preferred individual compound for use in the process according to the invention is bis(3,3,3-trifluoropropyl)tetramethyldisilazane. A mixture of these compounds could range from 25% to 75% by weight of the haloalkylsilane, and from 25% to 75% by weight of the haloalkyldisilazane, with the weight percent based upon the total weight of the mixture. Preferably, the mixture will include 50% by weight of the haloalkylsilane, and 50% by weight of the haloalkyldisilazane. The weight percent of each compound is based upon the total weight of the mixture.

A possible explanation for the excellent storage stability and the beneficial effect on the thermal oxidation of the wafers treated in accordance with the invention is that the organosilicon reagent enters into condensation reactions with the hydrophilic wafer surface and crosslinks to form a surface layer. In the course of the thermal oxidation, this layer releases, at temperatures from 200° C. upwards, hydrogen halides and halogen radicals which develop the OSF-reducing and oxidation-acceleration action described at the outset.

The storage stability of the wafer surfaces treated with the organosilicon reagent is readily demonstrated in the so-called "tropical test." The prepared wafers are exposed for a fairly long time in a climatic chamber to a moist atmosphere which promotes the formation of haze effects which appear when it is examined for clouding on the surfaces.

The quality of the oxidation layer produced can be checked using the known methods of ellipsometry and breakdown voltage measurement. The measurement results yield, inter alia, information about the thickness of the oxide layer, the thickness distribution and the integrity of the layer.

The present invention has the following advantages. The treatment of polished silicon wafers by the process in accordance with the invention does away with the HF immersion bath hitherto standard for cleaning purposes and the addition of halogen-containing gases hitherto necessary for the thermal oxidation. The storage stability of the hydrophilized wafer surfaces coated with the organosilicon reagent is excellent. The protective layer is removed in the course of the thermal oxidation without the wafer surface being contaminated in the process. The oxide layer produced has, in addition, characteristic data which are in the region of the optimum at present achievable.

DETAILED DESCRIPTION OF PREFERRED EMBODIMENTS

Other objects and features of the present invention will become apparent from the following detailed description considered in connection with the accompanying example which discloses several embodiments of the present invention. It should be understood, however, that the example is designed for the purpose of illustration only and not as a definition of the limits of the invention.

EXAMPLE

Polishing agent residues were first removed from 16 silicon wafers polished on one side and having a diameter of 100 mm and a (100) crystal orientation, and then the wafers were subjected essentially to a hydrophilizing treatment with hydrogen peroxide/ammonia in accordance with the "RCA cleaning" cited. The wafers were then rinsed and dried and divided into two reference batches and two test batches. While one wafer reference batch was immediately subjected to a tropical test in the climatic chamber, all the test wafers were exposed to the organosilicon reagent beforehand. For this purpose, they were placed together with 1 ml of bis(3,3,3-trifluoropropyl)tetramethyldisilazane in the packaging which is standard for the dispatch and storage of semiconductor wafers and the packaging was sealed with polyethylene sheet in a gas-tight manner by welding. The atmosphere which built up and contained the reagent acted on the wafer surfaces for 24 hours at room temperature. Then a batch of test wafers was also subjected to the tropical test for comparison purposes. For this purpose, the sealed packages, from which the gas-tight sheet had of course been removed, were stored in a climatic chamber for 7 days at 22° C. in air saturated with water vapor. The second reference batch was introduced into a standard reactor for thermal oxidation immediately after the hydrophilizing treatment of the wafer surfaces, while the second test batch was introduced into it immediately after exposure to the organosilicon reagent. In contrast to the reference wafers, in the case of which trichloroethane was added as halogen-containing gas in the conventional manner, the test wafers treated in accordance with the invention were thermally oxidized without this addition. In other respects, all the wafers experienced the same oxidation conditions.

In contrast to the reference wafers, the wafers of the test batch exhibited no haze formation of any kind during the evaluation of the tropical test in the focused light beam of the lamp which visualizes the clouding.

The measurement of the quality of the oxidation layer also yielded markedly more beneficial values for the test wafers. The breakdown voltages were determined at approximately 60 points on each wafer surface in the case of three reference wafers and three test wafers. While 86.9% of the measurement points had the breakdown strength normally required in the case of the reference wafers, this proportion was 96.3% in the case of the wafers treated in accordance with the invention. The result of measuring the thickness of the oxide layer is summarized in the table below:

TABLE

| Wafer No. | Reference Wafers | | | Test Wafers | | |
|---|---|---|---|---|---|---|
| | Oxide thickness, in nm | max. thickness difference, in nm | 3 σ | Oxide thickness, in nm | max. thickness difference, in nm | 3 σ |
| 1 | 23.4 | 2.2 | 1.44 | 24.2 | 1.0 | 0.82 |
| 2 | 23.5 | 1.44 | 0.9 | 24.4 | 1.1 | 0.8 |
| 3 | 23.8 | 2.24 | 1.5 | 24.8 | 1.13 | 0.94 |
| Mean Values | 23.6 | 2.0 | 1.3 | 24.5 | 1.1 | 0.9 |

Accordingly, both within one wafer and between different wafers in one oxidation run, the thicknesses of the oxide layer of the reference wafers varied to a substantially greater extent than the thicknesses of the oxide layer of the test wafers.

While several embodiments of the present invention have been shown and described, it is to be understood that many changes and modifications may be made thereunto without departing from the spirit and scope of the invention as defined in the appended claims.

What is claimed is:

1. A process for producing storage-stable polished surfaces for a silicon wafer having advantageous oxidation properties comprising:
   hydrophilizing the polished wafer surfaces;
   subsequently exposing said polished wafer surfaces to an organosilicon reagent; and
   using as said organosilicon reagent a compound selected from the group consisting of haloalkylsilanes having the formula $$R_x^1 SiR_y^S (OR^2)_{4-x-y}$$

haloalkyldisilazanes having the formula $$(R_x^1 R_{3-x}^2 Si)_2 NH$$

and the mixtures thereof,
   where $R^1$ is a haloalkyl radical, $R^2$ is an alkyl radical, x is an integer from 1 to 3, and y is the numeral 0 or 1.

2. The process as claimed in claim 1, wherein exposing the organosilicon reagent is carried out at a temperature below 150° C.

3. The process as claimed in claim 1, wherein the haloalkyl moiety in the organosilicon reagent is fluoroalkyl or chloroalkyl.

4. The process as claimed in claim 1, wherein the chain length of the haloalkyl radical $R^1$ is from 1 to 3 carbon atoms.

5. The process as claimed in claim 1, wherein $R^2$ is an alkyl selected from the group consisting of methyl and ethyl.

6. The process as claimed in claim 1, wherein the organosilicon reagent has a vapor pressure of 0.5 hPa at a temperature of 25° C. and a pressure of 1,000 hPa.

7. The process as claimed in claim 1, wherein a silicon wafer polished on one or two sides is treated.

8. The process as claimed in claim 1, wherein the hydrophilizing of the polished wafer surfaces is carried out in the form of an alkaline oxidative cleaning treatment.

9. The process as claimed in claim 1, wherein the hydrophilizing of the polished wafer surfaces is carried out in the form of an acidic oxidative cleaning treatment.

10. The process as claimed in claim 1, wherein the hydrophilizing of the polished wafer surfaces is carried out in the form of an ozonizing cleaning treatment.

11. The process as claimed in claim 1, wherein the organosilicon reagent is 1,3,3,3-tetrachloropropyltrimethoxysilane.

12. The process as claimed in claim 1, wherein the organosilicon reagent is 3,3,3-trifluoropropylmethyldimethoxysilane.

13. The process as claimed in claim 1, wherein the organosilicon reagent is bis(3,3,3-trifluoropropyl)tetramethyldisilazane.

14. The process as claimed in claim 1, wherein said mixture composition is from 25% to 75% by weight of the haloalkylsilane; and is from 25% to 75% by weight of the haloalkyldisilazane, with the weight being based upon the total weight of the mixture.

15. The process as claimed in claim 1, wherein said mixture composition is 50% by weight of the haloalkylsilane, and 50% by weight of the haloalkyldisilazane, with the weight being based upon the total weight of the mixture.

16. The process as claimed in claim 1, wherein the organosilicon reagent is selected from the group consisting of 1,3,3,3-tetrachloropropyltrimethoxysilane, 3,3,3-trifluoropropylmethyldimethoxysilane, and bis(3,3,3-trifluoropropyl)tetramethyldisilazane.

17. Silicon wafers produced by a process as claimed in claim 1.

18. A process for producing storage-stable polished surfaces for a silicon wafer having advantageous oxidation properties comprising:
hydrophilizing the polished wafer surfaces;
subsequently exposing said polished wafer surfaces to an organosilicon reagent; and
using as said organosilicon reagent a compound having the formula $$R_x^1 SiR_y^2 (OR^2)_{4-x-y}$$

where $R^1$ is a haloalkyl radical, $R^2$ is an alkyl radical, x is an integer from 1 to 3, and y is the numeral 0 or 1.

19. The process as claimed in claim 18, wherein the organosilicon reagent is selected from the group consisting of 1,3,3,3-tetrachloropropyltrimethoxysilane and 3,3,3-trifluoropropylmethyldimethoxysilane.

20. Silicon wafers produced by a process as claimed in claim 18.

* * * * *